United States Patent [19]

Deacon

[11] Patent Number: 4,799,066
[45] Date of Patent: Jan. 17, 1989

[54] IMPEDANCE MATCHING ARRANGEMENT

[75] Inventor: Malcolm J. Deacon, Chelmsford, England

[73] Assignee: The Marconi Company Limited, Middlesex, England

[21] Appl. No.: 887,057

[22] Filed: Jul. 18, 1986

[30] Foreign Application Priority Data

Jul. 26, 1985 [GB] United Kingdom ............... 8518967
Dec. 6, 1985 [GB] United Kingdom ............... 8530158

[51] Int. Cl.$^4$ ............................................. H01Q 1/50
[52] U.S. Cl. .................................. 343/861; 343/850; 343/860
[58] Field of Search ................... 343/850, 860, 861; 333/17 M; 455/320, 284, 290

[56] References Cited

U.S. PATENT DOCUMENTS

| | | | |
|---|---|---|---|
| 2,910,655 | 10/1959 | Ludvigson | 333/17 M |
| 3,160,832 | 12/1964 | Beitman et al. | 343/861 |
| 4,015,223 | 3/1977 | Cheze | 333/17 M |
| 4,085,405 | 4/1978 | Barlow | 343/850 |
| 4,493,112 | 1/1985 | Bruene | 343/861 |
| 4,612,669 | 9/1986 | Nossen | 343/861 |

FOREIGN PATENT DOCUMENTS 2346901 4/1976 France .

OTHER PUBLICATIONS

Abstract of Japanese Patent Application No. 59-50619, vol. 8, No. 139 (E-253) <1576>, Jun. 28th, 1984.

Primary Examiner—William L. Sikes
Assistant Examiner—Hoanganh Le
Attorney, Agent, or Firm—Spencer & Frank

[57] ABSTRACT

An impedance matching arrangement is suitable for use with a frequency hopping radio communications system which is operable over a wide frequency band, so as to match the operating impedance of the antenna at each of the frequencies used. As the frequency of the radio system hops from one frequency to another, a note of any impedance mismatch is noted and data derived therefrom is stored for future use when that frequency is next selected so as to reduce any impedance mismatch.

17 Claims, 2 Drawing Sheets

IMPEDANCE MATCHING ARRANGEMENT

BACKGROUND OF THE INVENTION

This invention relates to an impedance matching arrangement which is required to operate over a wide frequency band. It is particularly suitable for use with a frequency hopping radio communications system, in which the operating characteristics can depend to a marked extent on the frequency to which the system is tuned.

SUMMARY OF THE INVENTION

According to this invention an impedance matching arrangement includes variable frequency means operative in a mode in which certain frequencies occur repetitively coupled to a frequency dependent impedance; impedance compensation means adapted to present to said variable frequency means compensation for the impedance variation of said frequency dependent impedance; and means responsive to an impedance mismatch at a particular frequency for controlling the characteristics of said impedance compensation means when said particular frequency recurs so as to reduce said mismatch.

The invention is particularly suitable for use with a radio receiver and/or a transmitter which is operative in a frequency hopping mode over a wide frequency band. The use of frequency hopping involves tuning the radio receiver or transmitter to a particular frequency for a very short period of time during which a portion of a message is transmitted or received. By altering the tuned frequency many times a second, transmission of the message is very secure as it is difficult for a third party to intercept it without knowledge of the pattern of frequencies used, and as each frequency is transmitted for such a short period of time it is not easy to locate the transmitter using radio direction finding techniques.

When the frequency band is wide, problems arise with the variation in impedance which can occur with certain component parts of the system, notably with the antenna. It is important that the impedance of the antenna should be matched to that of the variable frequency transmitter or receiver as otherwise power transfer to the antenna is not maximised. If the transmitter or receiver of a communications system is mobile, the impedance at a particular frequency can alter quite significantly depending on the nature of its local surroundings, and it is therefore very desirable to adaptively control the effective impedance of the antenna so that the impedance presented to a transmitter or receiver remains substantially constant with varying frequency, and with physical movement of the antenna. Preferably the impedance compensation means is positioned between the variable frequency means of the transmitter or receiver and the antenna, and a discriminator is arranged to monitor the characteristics of a signal so as to determine whether its voltage standing wave ratio (VSWR) is within acceptable limits or not during the period of time that the variable frequency means is tuned to a particular frequency. Next time that the same frequency is used the previously acquired data is used to control the impedance compensation means. Tuning is typically adjusted in an iterative manner during several successive occasions on which the same frequency is used, until a sufficiently good impedance match is achieved. Data of this kind can be stored for many frequencies over an extended period of time, and can be updated due to changing circumstances so that at any moment in time the magnitude of any impedance mismatch will be fairly small, thereby enabling the communications system to operate with maximum performance and enabling any new errors to be rapidly corrected.

BRIEF DESCRIPTION OF THE DRAWINGS

The invention is further described by way of example with reference to the accompanying drawings, in which.

DESCRIPTION OF THE PREFERRED EMBODIMENT

Figure 1:
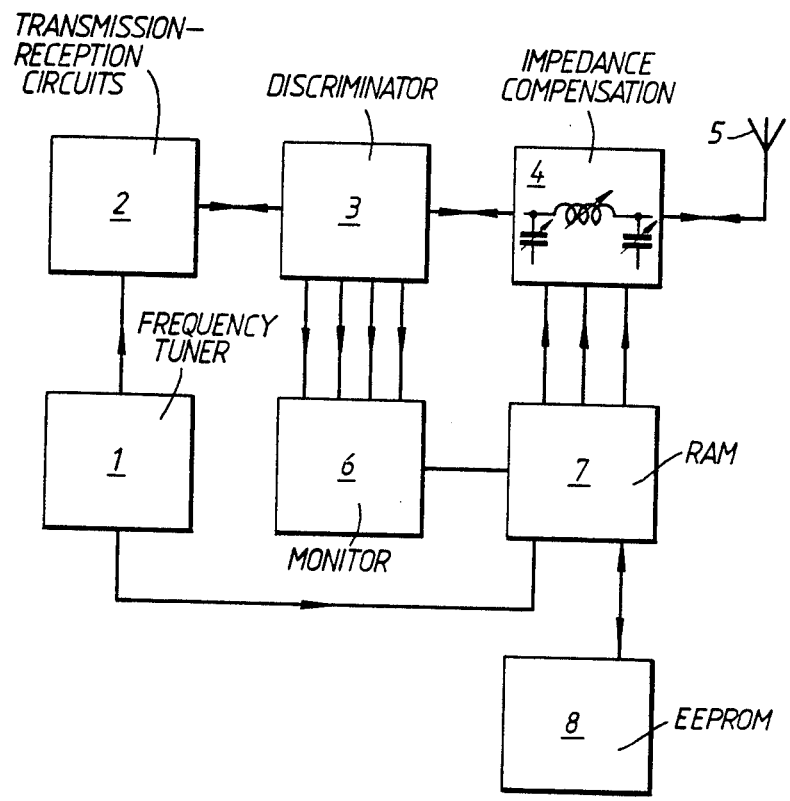
FIG. 1 illustrates in diagramatic form an impedance matching arrangement which is used in a communications system.

Referring to FIG. 1, there is shown therein a radio transmitter/receiver having a frequency synthesiser 1 which is operative to tune the transmission and reception circuits 2 of the radio. These circuits are coupled via a signal discriminator 3 and an impedance compensation circuit 4 to an antenna 5. Such a system is capable of operation in a frequency hopping mode over the "high frequency" band which extends from 1.6 MHz to 30 MHz. Because of the fixed dimensions of the antenna 5, its impedance varies very significantly over this band so that the antenna 5 itself cannot exhibit a constant 50Ω impedance. The circuits 2 are however, designed to operate into a load of 50Ω, and if the load departs significantly from the design figure, operation of the communications system can be greatly impaired. The discriminator 3 is operative to monitor the characteristics of the signal on the line to determine the phase of the load, the resistance of the load, the power on the line, and the level of signal reflection. These properties can be readily measured, and in response thereto the impedance compensation circuit 4 is altered so that the impedance nearer to the correct design value is presented to the circuits 2. The correct impedance value may be achieved only after several adjustments have been made on successive occasions on which a particular frequency is used. The final value is obtained in an iterative manner, i.e. the effect of previous adjustment is noted on the next time that the same frequency is used, and the next adjustment is then made accordingly. A monitor and control circuit 6 determines the new impedance matching value required and enters them into a random access memory (RAM) 7 where they are held until the frequency synthesiser 1 indicates that the same frequency is to be used again in a subsequent frequency hop. The impedance matching values are then read from the memory 7 into the impedance compensation circuit 4 to adjust the values of the inductance and capacitors which comprise this circuit. In practice, this circuit 4 consists of a large bank of inductors and capacitors having a wide range of different values which can be switched into use when required. In general a different combination will be switched into use for each different frequency used in the frequency hopping system.

In order to enable very rapid frequency hopping to occur, the frequency synthesiser 1 sends to the monitor and control circuit 6 the value of the frequency to be used on the next frequency hop. The memory and control circuit 6 converts the frequency value to an address of the random access memory 7 where the required impedance matching values are assembled for utilisation at the required instant.

To preserve the impedance matching values over long periods of time when the equipment is not in use, or when another antenna with different impedance characteristics is used they are periodically entered into an electronically eraseable programmable read only memory (EEPROM) 8. When the radio is first switched on after having been unused for some time, the data preserved in the memory 8 is down loaded into the memory 7 and is used as needed. It is unlikely that large changes to the stored impedance values will be needed, allowing the correct impedance to be obtained after only a few occurrences of each specified frequency.

Figure 2:
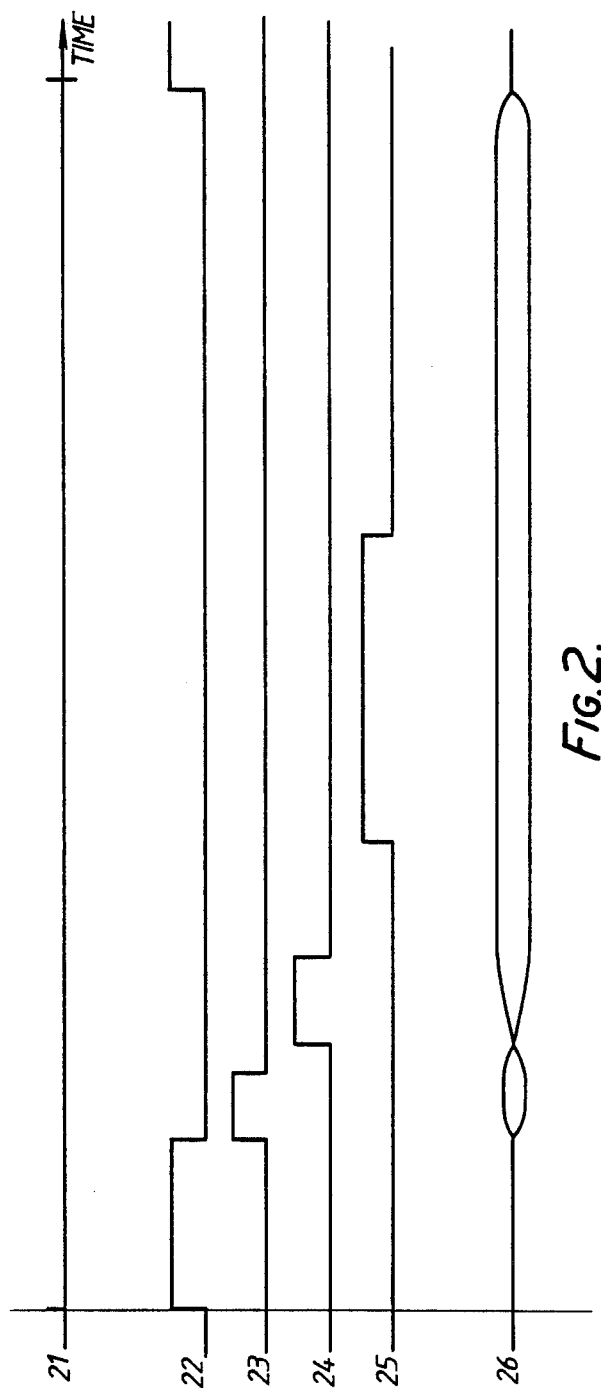
FIG. 2 is an explanatory diagram.

FIG. 2 shows a tuning diagram in which line 21 indicates the duration of a hop period, i.e. the period during which the tuned frequency is constant, after which it abruptly alters to its next value. Line 22 indicates the interval at the start of the hop period during which the capacitors and inductors of the circuit 4 are physically switched to give the stored values for the selected frequency. Subsequently, a short tone is transmitted at the selected frequency as shown in line 23, and during this period the discriminator is operative to determine whether a further correction will be needed next time this frequency is selected. If so, the correction is calculated and the new impedance matching value is determined during the period shown in line 24 and entered into memory 7 together with the frequency value to which it relates. Between the start of periods 22 and 25, the next frequency value to be selected is communicated. During period 25 this is computed to a memory address to enable the next set of impedance matching values to be assembled for use at the start of the next hop period. The line 26 shows the periods during which an r.f. signal output is produced in the case of a transmitter.

I claim:

1. An impedance matching arrangement including signal processing means tunable to a selected one of a plurality of frequencies and operative in a mode in which certain of the frequencies occur repetitively, coupled to a frequency dependent impedance; impedance compensation means adapted to present to said signal processing means compensation for the impedance variation of said frequency dependent impedance; and means responsive to an impedance mismatch at a particular frequency for controlling the characteristics of said impedance compensation means when said particular frequency recurs so as to reduce said mismatch.

2. An arrangement as claimed in claim 1 in which the frequency dependent impedance is constituted by an antenna.

3. An arrangement as in claim 1, wherein said controlling means includes means for monitoring signal characteristics of a signal in said arrangement, which signal characteristics depend on the frequency tuned by said signal processing means, means for storing the signal characteristics for subsquent use when the same frequency recurs, and means for adjusting said impedance compensation means according to the signal characteristics stored when the same frequency recurs.

4. An impedance matching arrangement of a frequency hopping radio communication system, said arrangement including signal processing means tunable to a selected one of a plurality of frequencies and operative in a mode in which certain of the frequencies occur repetitively, coupled to an antenna having a frequency dependent impedance; impedance compensation means adapted to present to said signal processing means compensation for the impedance variation of said frequency dependent impedance; and means responsive to an impedance mismatch at a particular frequency for controlling the characteristics of said impedance compensation means when said particular frequency recurs so as to reduce said mismatch.

5. An arrangement as claimed in claim 4 and wherein the impedance compensation means is positioned between the signal processing means of the transmitter or receiver and the antenna, and a discriminator is arranged to monitor the characteristics of a signal so as to determine whether its voltage standing wave ratio (VSWR) is within acceptable limits or not during the period of time that the signal processing means is tuned to a particular frequency.

6. An arrangement as claimed in claim 5 and wherein the results of monitoring by said discriminator are entered into a store for subsequent use when the same frequency is next required.

7. An arrangement as claimed in claim 6 and wherein the stored results are read out of the store during the frequency hop which precedes the hop at which the related frequency recurs so that the results are available to adjust said impedance compensation means.

8. An arrangement as claimed in claim 6 and wherein a back-up memory is provided to give long term storage of said results, or of data derived therefrom.

9. An arrangement as claimed in claim 7 and wherein a back-up memory is provided to give long term storage of said results, or of data derived therefrom.

10. An impedance matching arrangement, comprising:
    signal processing means tunable to selected frequencies, to be coupled to a frequency dependent impedance, said signal processing means being operative in a mode in which it is repetitively tuned to certain frequencies;
    impedance compensation means for presenting to said signal processing means compensation for impedance variation of the frequency dependant impedance when the frequency dependent impedance is coupled to said signal processing means; and
    means, responsive to an impedance mismatch at a tuning of said signal processing means to a particular frequency, for controlling characteristics of said impedance compensation means when the frequency dependent impedance is coupled to said signal processing means and the tuning of said signal processing means to the particular frequency recurs, so as to reduce the mismatch.

11. An arrangement as in claim 10, further comprising a frequency dependent impedance coupled to said signal processing means, said frequency dependent impedance comprising an antenna.

12. In a frequency hopping radio communication system having a frequency dependent antenna and signal processing means coupled to said frequency dependent antenna and tunable to selected frequencies, said signal processing means being operative in a mode in which the frequency of said signal processing means hops rapidly from being tuned to one frequency to being tuned to another and tuning to certain frequencies occurs repetitively, the improvement comprising:
    impedance compensation means for presenting to said signal processing means compensation for impedance variation of said frequency dependent antenna; and means, responsive to an impedance mismatch at a tuning of said signal processing means to a particular frequency, for controlling characteristics of said impedance compensation means when the tuning of said signal processing means to the particular frequency recurs, so as to reduce the mismatch.

13. The system as in claim 12, further comprising a discriminator having means for monitoring characteristics of a signal between said signal processing means and said antenna so as to determine whether its voltage standing wave ratio (VSWR) is within predetermined limits during a time period in which said signal processing means is tuned to the particular frequency, and wherein said impedance compensation means is coupled to said signal processing means between said antenna and said signal processing means.

14. The system as in claim 13, further comprising means for storing for subsequent use when the tuning of said signal processing means to the particular frequency recurs, results of the monitoring by said monitoring means, and for entering the results into said storing means.

15. The system as in claim 14, wherein the results stored in said storing means are read out of said storing means during a frequency hop which precedes a frequency hop during which the tuning of said signal processing means to the particular frequency recurs, so that the results are available for adjusting said impedance compensation means.

16. The system as in claim 15, further comprising a back-up memory means for providing long term storage of the results or data derived from the results.

17. The system as in claim 14, further comprising a back-up memory means for providing long term storage of the results or data derived from the results.

* * * * *